(12) United States Patent
Reznicek et al.

(10) Patent No.: US 10,090,290 B1
(45) Date of Patent: Oct. 2, 2018

(54) STACKED ELECTROSTATIC DISCHARGE DIODE STRUCTURES

(71) Applicant: International Business Machines Corporation, Armonk, NY (US)

(72) Inventors: Alexander Reznicek, Troy, NY (US); Bahman Hekmatshoartabari, White Plains, NY (US); Karthik Balakrishnan, White Plains, NY (US); Tak Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/659,691

(22) Filed: Jul. 26, 2017

(51) Int. Cl.
| | |
|---|---|
| *H01L 21/70* | (2006.01) |
| *H01L 27/02* | (2006.01) |
| *H01L 29/06* | (2006.01) |
| *H01L 23/528* | (2006.01) |
| *H01L 21/762* | (2006.01) |
| *H01L 21/768* | (2006.01) |
| *H01L 23/532* | (2006.01) |

(52) U.S. Cl.
CPC .... *H01L 27/0255* (2013.01); *H01L 21/76224* (2013.01); *H01L 21/76879* (2013.01); *H01L 21/76883* (2013.01); *H01L 23/528* (2013.01); *H01L 23/53214* (2013.01); *H01L 23/53228* (2013.01); *H01L 23/53242* (2013.01); *H01L 23/53257* (2013.01); *H01L 29/0649* (2013.01)

(58) Field of Classification Search
CPC ......... H01L 21/76224; H01L 21/76879; H01L 21/76883; H01L 23/528; H01L 23/53214; H01L 23/53228; H01L 23/53242; H01L 23/53257; H01L 29/0649
See application file for complete search history.

(56) References Cited

U.S. PATENT DOCUMENTS

| | | | |
|---|---|---|---|
| 5,557,114 A * | 9/1996 | Leas | ............... H01L 25/043 257/290 |
| 6,430,016 B1 | 8/2002 | Marr | |
| 6,768,617 B2 | 7/2004 | Marr | |
| 6,933,573 B2 | 8/2005 | Ker et al. | |
| 7,141,484 B2 | 11/2006 | Ker et al. | |
| 7,969,697 B2 | 6/2011 | Farzan et al. | |
| 9,019,672 B2 | 4/2015 | Chen | |
| 2008/0150080 A1 | 6/2008 | Thiem et al. | |
| 2015/0022920 A1 | 1/2015 | Chen | |
| 2015/0097264 A1* | 4/2015 | Tsai | ............... H01L 27/0255 257/506 |
| 2016/0218503 A1 | 7/2016 | La Rosa et al. | |

FOREIGN PATENT DOCUMENTS

KR    10-0606883 B1    8/2006

* cited by examiner

*Primary Examiner* — Yosef Gebreyesus
(74) *Attorney, Agent, or Firm* — Scully, Scott, Murphy & Presser, P.C.; Louis J. Percello, Esq.

(57) ABSTRACT

An electrostatic discharge (ESD) protection structure containing a bottom diode and a top diode vertically stacked on the bottom diode is provided to render sufficient protection from ESD events with reduced diode footprint. The bottom diode is serially connected to the top diode via a conductive strap structure.

13 Claims, 11 Drawing Sheets

FIG. 13B

STACKED ELECTROSTATIC DISCHARGE DIODE STRUCTURES

BACKGROUND

The present application relates to semiconductor device fabrication, and more specifically to the fabrication of an electrostatic discharge (ESD) protection structure containing vertically stacked diodes.

It is well known that extremely high voltages can develop in the vicinity of an integrated circuit due to the build-up of static charge. When the electrostatic energy is discharged, a high current is produced through devices of the integrated circuit. Electrostatic discharge (ESD) is a serious problem for semiconductor devices, since it has the potential to destroy the device and the entire integrated circuit. ESD protection devices are generally integrated into the integrated circuits to protect the circuits from ESD events. An ESD protection device can provide a current path so that when an ESD transient occurs, the ESD current is conducted through the ESD protection device without going through the devices to be protected.

Figure 1:
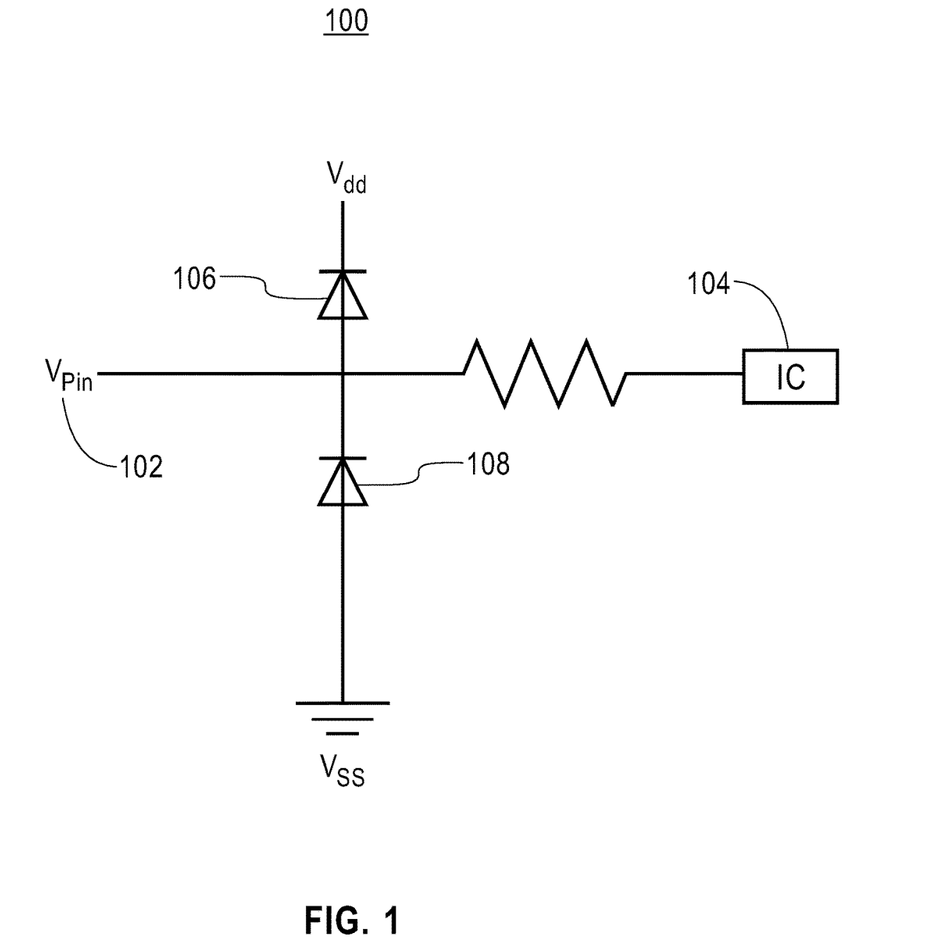
FIG. 1 illustrates a basic ESD protection circuitry.

Diodes are needed to form ESD protection devices. FIG. 1 illustrates a basic ESD protection circuitry 100 in which an I/O pin 102 accepts a high voltage or a high current discharge that could occur with an ESD event. In order to protect the integrated circuit (IC) 104 from negative effects of the ESD event, a first diode 106 discharges the excess voltage to a supply voltage Vdd. In some cases, and when a negative high voltage (or current) occurs, a second diode 108 discharges the excess voltage to ground Vss. Unfortunately, those diodes 106, 108 are implemented as planar diodes and thus take up a relatively large area of real estate on the chip. Therefore, there remains a need to provide ESD protection structures with reduced diode footprint (i.e., the total chip area occupied by the diodes).

SUMMARY

The present application provides an ESD protection structure containing vertically stacked diodes to provide sufficient protection from ESD events with reduced diode footprint.

According to an embodiment, a semiconductor structure is provided. In one embodiment, the semiconductor structure includes a bottom diode and a top diode vertically stacked on the bottom diode. The bottom diode includes a first well region of a first conductivity type embedded in a semiconductor substrate, and a first doped semiconductor portion of a second conductivity type located on the first well region. The second conductivity type is opposite from the first conductivity type. The top diode a second doped semiconductor portion of the first conductivity type located on the first doped semiconductor portion, and a third doped semiconductor portion of the second conductivity type located on the second doped semiconductor portion. The semiconductor structure further includes a conductive strap structure laterally contacting the first doped semiconductor portion and the second doped semiconductor portion.

In another embodiment, the semiconductor structure includes a plurality of first well regions of a first conductivity type and a plurality of second well regions of a second conductivity type embedded in a semiconductor substrate. The second conductivity type is opposite from the first conductivity type. The semiconductor structure also includes a first doped semiconductor portion of the second conductivity type located on each of the plurality of first well regions, a second doped semiconductor portion of the first conductivity type located on each first doped semiconductor portion, and a third doped semiconductor portion of the second conductivity type located on each second doped semiconductor portion. A conductive strap structure is present on sidewalls of each stack of the first doped semiconductor portion and the second doped semiconductor portion. Adjacent conductive strap structures are connected by a shared contact structure.

According to another embodiment, a method of forming a semiconductor structure is provided. The method includes first forming a plurality of first well regions of a first conductivity and a plurality of second well regions of a second conductivity type in a surface portion of a semiconductor substrate. The second conductivity type is opposite from the first conductivity type. A stack including a first doped semiconductor portion of the second conductivity type and a second doped semiconductor portion of the first conductivity type is then formed on each of the plurality of first well regions. The adjacent stacks are electrically insulated from each other by a shallow trench (STI) layer. Next, after forming a conductive strap structure on sidewalls of each stack of the first doped semiconductor portion and the second doped semiconductor portion, an interlevel dielectric (ILD) layer is formed on the STI layer, each conductive strap structure and each second doped semiconductor portion. Next, an opening is formed to expose at least a portion of each second doped semiconductor portion. A third doped semiconductor portion is then formed on the exposed portion of each second doped semiconductor portion, followed by forming a contact landing structure on each third doped semiconductor portion.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2:
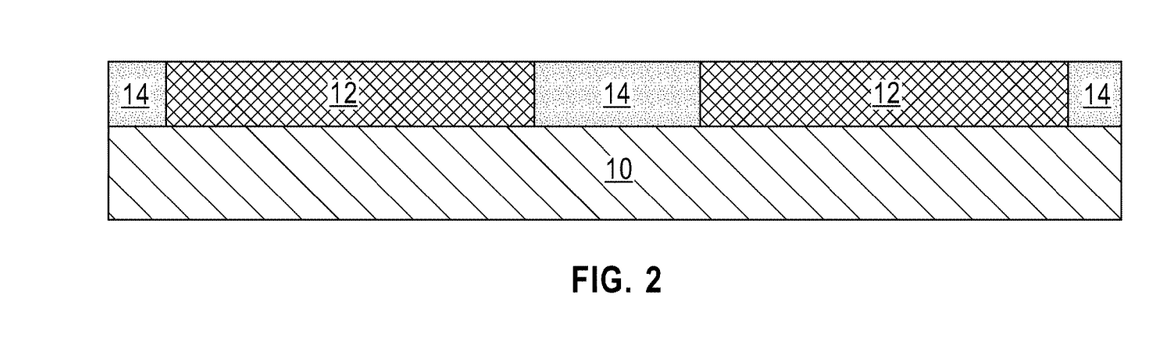
FIG. 2 is a cross-sectional view of an exemplary semiconductor structure according to an embodiment of the present application including a semiconductor structure having first and second well regions formed therein.

Referring to FIG. 2, there is illustrated an exemplary semiconductor structure including a semiconductor structure 10 having well regions formed in the surface portion of the semiconductor substrate 10. The well regions may include a set of first well regions 12 and a set of second well regions 14. Adjacent first well regions 12 are separated by a second well region 14. The second well regions 14 have a conductivity type opposite to that of the first well regions 12. In one embodiment, the first well regions 12 are p-well regions doped with a p-type dopant, and the second well regions 14 are n-well regions doped with an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. Each first well region 12 serves as a bottom component of a bottom diode subsequently formed. It should be noted that although two first well regions 12 are shown in FIG. 1, any number of first well regions 12 can be formed in the present application.

The semiconductor substrate 10 can be a bulk semiconductor substrate including at least one semiconductor material that contiguously extends from a topmost surface of the semiconductor substrate 10 to a bottommost surface of the semiconductor substrate 10 or a top semiconductor material layer of a semiconductor-on-insulator (SOI) substrate. The semiconductor substrate 10 may include any semiconductor material including, for example, Si, Ge, SiGe, SiC, SiGeC, InAs, InP, InAsP, GaAs, and all other III-V or II-VI compound semiconductor materials. In one embodiment of the present application, the semiconductor substrate 10 is composed of silicon. The semiconductor material that provides the semiconductor substrate 10 is typically a single crystalline semiconductor such as, for example, single crystalline silicon.

The well regions 12, 14 may be formed by introducing dopants to selected portions of the semiconductor substrate 10 using separate masking and implantation processes. To form the first well regions 12, a mask is placed over the semiconductor substrate 10 and patterned to form openings corresponding to the first well regions 12. The mask may be a photoresist layer or a photoresist layer in conjunction with hard mask layer(s). Thereafter, a first well implantation is performed to introduce a dopant of a first conductivity type into exposed regions of the semiconductor substrate 10, thereby forming the first well regions 12. In one embodiment and when the first well regions 12 are p-well regions, the concentration of the p-type dopant in each first well region 12 can be from $1 \times 10^{17}$ atoms/cm$^3$ to $1 \times 10^{19}$ atoms/cm$^3$, although lesser and greater concentrations can also be employed. After the first well implantation process is completed, the mask can be removed, for example, by oxygen-based plasma.

Similarly, to from the second well regions 14, a separate mask is placed over the semiconductor substrate 10 and patterned to form openings corresponding to the second well regions 14. After patterning, a second well implantation is performed to introduce a dopant of a second conductivity type into exposed regions of the semiconductor substrate 10, thereby forming the second well regions 14. The second conductivity type is opposite to the first conductivity type. For example, when the first conductivity type is p-type, the second conductivity type is n-type, and vice versa. In one embodiment and when the second well regions 14 are n-well regions, the concentration of the n-type dopant in each second well region 14 can be from $1 \times 10^{19}$ atoms/cm$^3$ to $4 \times 10^{20}$ atoms/cm$^3$, although lesser and greater concentrations can also be employed. After the second well implantation process is completed, the mask can be removed, for example, by oxygen-based plasma.

Figure 3:
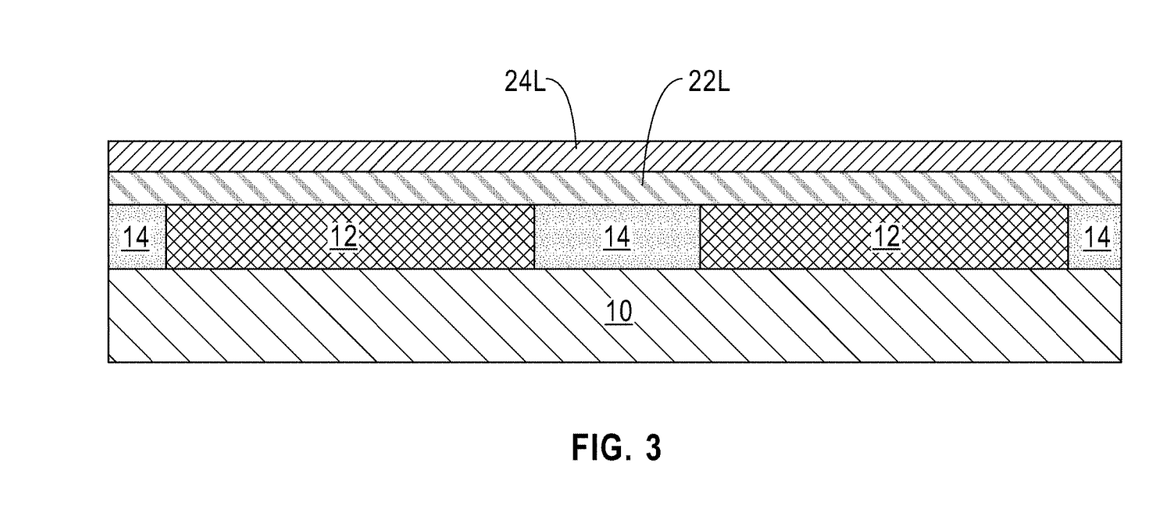
FIG. 3 is a cross-sectional view of the exemplary semiconductor structure of FIG. 2 after sequentially forming a first doped semiconductor layer and a second doped semiconductor layer on the semiconductor substrate.

Referring to FIG. 3, there is illustrated the exemplary semiconductor structure of FIG. 2 after forming a first doped semiconductor material layer 22L on the semiconductor substrate 10 followed by forming a second doped semiconductor material layer 24L on the first doped semiconductor material layer 22L.

The first doped semiconductor material layer 22L may include any semiconductor material as mentioned above for the semiconductor substrate 10. For example, the first doped semiconductor material layer 22L may include Si, Ge, SiGe, SiC, SiGeC, InAs, InP, InAsP or GaAs. In one embodiment of the present application, the first doped semiconductor material layer 22L includes a same semiconductor material as the semiconductor material that provides the semiconductor substrate 10. For example, both first doped semiconductor material layer 22L and semiconductor substrate 10 may be composed of silicon. In another embodiment of the present application, the first doped semiconductor material layer 22L includes a different semiconductor material than the semiconductor material that provides the semiconductor substrate 10. For example, the first doped semiconductor material layer 22L may be composed of SiGe and the semiconductor substrate 10 may be composed of silicon.

The first doped semiconductor layer 22L is counter-doped with respect to the first well regions 12, thereby forming a p-n junction with each first well region 12. For example, when the first well regions 12 are p-doped, the first doped semiconductor layer 22L is n-doped. The first doped semiconductor material layer 22L may be formed on top of the semiconductor substrate 10 utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material layer that is formed by an epitaxial deposition process has the same crystalline characteristics as the deposition surface on which it is formed. For example, an epitaxial semiconductor material layer deposited on a {100} crystal surface will take on a {100} orientation. In the present application, the first doped semiconductor material layer 22L has an epitaxial relationship, i.e., same crystal orientation, as that of the underlying semiconductor substrate 10.

Examples of various epitaxial growth processes that are suitable for use in forming the first doped semiconductor material layer 22L include, e.g., chemical vapor deposition (CVD), molecular beam epitaxy (MBE) and metal-organic chemical vapor deposition (MOCVD). The temperature for epitaxial deposition typically ranges from 350° C. to 900° C. Although higher temperature typically results in faster deposition, the faster deposition may result in crystal defects and film cracking.

A number of different source gases may be used for the deposition of the semiconductor material that provides the first doped semiconductor material layer 22L. In some embodiments, the source gas for the deposition of the semiconductor material that provides the first doped semiconductor layer 22L includes a silicon source gas, a germanium source gas or a mixture of a silicon-containing source gas and a germanium-containing source gas. Carrier gases like hydrogen, nitrogen, helium and argon can be used.

In some embodiments, the dopant of the second conductivity type can be introduced in-situ as the semiconductor material that provides the first doped semiconductor material layer 22L is being deposited, i.e., during the epitaxial growth process. In other embodiments, the dopant of the second conductivity type can be introduced into the first doped semiconductor layer 22L after the epitaxial growth process, for example, by ion implantation. The concentration of the dopant in the first doped semiconductor material layer 22L is determined by the conductivity types of dopants involved. For example, when the first doped semiconductor material layer 22L is n-doped, the concentration of the dopant in the first doped semiconductor material layer 22L can be from $1 \times 10^{19}$ atoms/cm$^3$ to $4 \times 10^{20}$ atoms/cm$^3$, although lesser and greater concentrations can also be employed. The thickness of the first doped semiconductor material layer 22L can be from 10 nm to 50 nm, although lesser and greater thicknesses can also be employed.

The second doped semiconductor layer 24L may include a semiconductor material the same as, or different from, the semiconductor material that provides the first doped semiconductor layer 22L. For example, both the first doped semiconductor layer 22L and the second doped semiconductor layer 24L may include silicon. The second doped semiconductor layer 24L is counter-doped with respect to the first doped semiconductor layer 22L. For example, when the first doped semiconductor layer 22L is n-doped, the second doped semiconductor layer 24L is p-doped. The concentration of the dopant in the second doped semiconductor layer 24L can be from $1 \times 10^{17}$ atoms/cm$^3$ to $1 \times 10^{19}$ atoms/cm$^3$, although lesser and greater concentrations can also be employed.

The second doped semiconductor layer 24L may be formed using an epitaxial growth process described above in formation of the first doped semiconductor layer 22L, so that the second doped semiconductor layer 24L has a same crystalline orientation as that of the first doped semiconductor layer 22L. For example, the second doped semiconductor layer 24L can be formed by CVD or MBE. The thickness of the second doped semiconductor layer 24L can be from 50 nm to 200 nm, although lesser and greater thicknesses can also be employed. The dopant in the second doped semiconductor layer 24L can be provided during the epitaxial growth process by in-situ doping, or after epitaxial growth process by ion implantation or gas phase doping.

Figure 4:
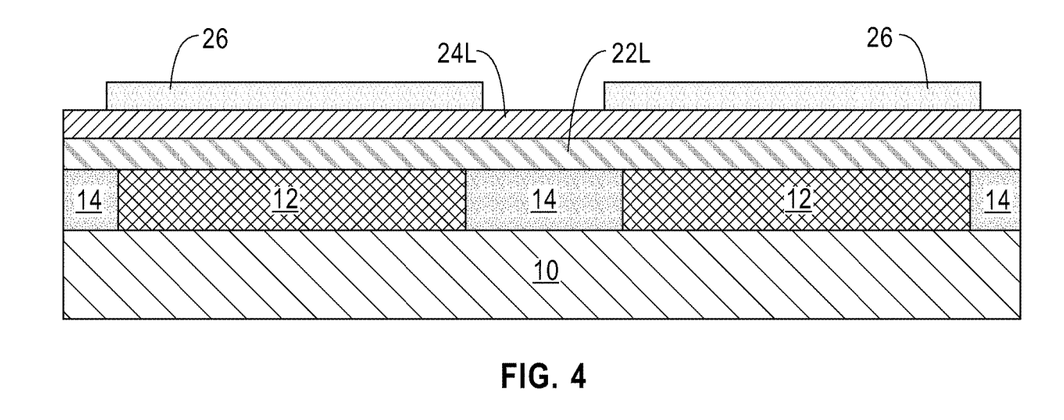
FIG. 4 is a cross-sectional view of the exemplary semiconductor structure of FIG. 3 after forming hard mask portions on the second doped semiconductor layer overlying the first well regions.

Referring to FIG. 4, there is illustrated the exemplary semiconductor structure of FIG. 3 after forming hard mask portions 26 on the second doped semiconductor layer 24L. Each hard mask portion 26 overlies a corresponding first well region 12, thereby protecting the underlying first well region 12 during subsequent etching. In one embodiment and as shown, each hard mask portion 26 also overlies peripheral portions of the second well regions 14 adjoined the first well region 12.

The hard mask portions 26 can be formed by first depositing a hard mask layer (not shown) as a blanket layer on the second doped semiconductor layer 24L. The hard mask layer may include a dielectric nitride such as, for example, silicon nitride. The hard mask layer may be deposited using, CVD, physical vapor deposition (PVD) or plasma enhanced chemical vapor deposition (PECVD). The thickness of the hard mask layer can be from 20 nm to 100 nm, although lesser and greater thicknesses can also be employed. The hard mask layer is then lithographically etched to form the hard mask portions 26. For example, a photoresist layer (not shown) can be applied over the hard mask layer and lithographically pattered to form a patterned photoresist layer atop portions of the hard mask layer. Portions of the hard mask layer that are not covered by the patterned photoresist layer are subsequently removed by an anisotropic etch. The anisotropic etch can be a dry etch such as, for example, reactive ion etch (RIE) or a wet etch involving a chemical etchant that removes the hard mask layer selective to the second doped semiconductor layer 24L. The remaining portions of the hard mask layer constitute the hard mask portions 26. If not removed during the pattern transfer process, the patterned photoresist layer can be removed utilizing a conventional resist stripping process such as, for example, ashing.

Figure 5:
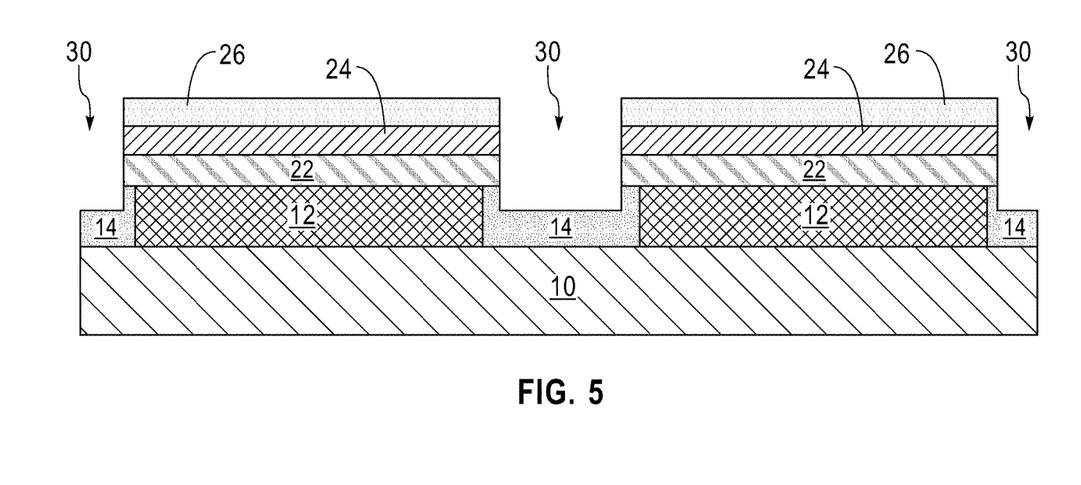
FIG. 5 is a cross-sectional view of the exemplary semiconductor structure of FIG. 4 after forming trenches extending through the second doped semiconductor layer and the first doped semiconductor layer and partially into the second well regions, thereby forming stacks, each stack having a first doped semiconductor portion and a second doped semiconductor portion overlying the first well regions.

Referring to FIG. 5, there is illustrated the exemplary semiconductor structure of FIG. 4 after forming trenches 30 extending through the second doped semiconductor layer 24L and the first doped semiconductor layer 22L and partially into the second well regions 14. The trenches 30 divide the first doped semiconductor layer 22L and the second semiconductor layer 24L into a plurality of stacks overlying the first well regions 12. Each stack includes, from bottom to top, a first doped semiconductor portion 22 and a second doped semiconductor portion 24. A portion of each second well region 14 is recessed to provide a recessed surface located below a top surface of each first well region 12. Each pair of the first well region 12 and the first doped semiconductor portion 22 collectively constitutes a bottom diode.

The trenches 30 can be formed by performing at least one etch using the hard mask portions 26 as etch masks. The at least one etch can be an anisotropic etch such as, for example, RIE. In one embodiment, a single anisotropic etching process may be performed to remove portions of the second doped semiconductor layer 24L, the first doped semiconductor layer 22L and the second well regions 14 that are not covered by the hard mask portions 26. In another embodiment, multiple anisotropic etching processes may be performed to sequentially remove portions of the second doped semiconductor layer 24L, the first doped semiconductor layer 22L and the second well regions 14 that are not covered by the hard mask portions 26. After etching, a portion of the second doped semiconductor layer 24L that remains covered by one of the hard mask portions 26 constitutes the second doped semiconductor portion 24, and a portion of the first doped semiconductor layer 22L that remains covered by one of the hard mask portions 26 constitutes the first doped semiconductor portion 22.

Figure 6:
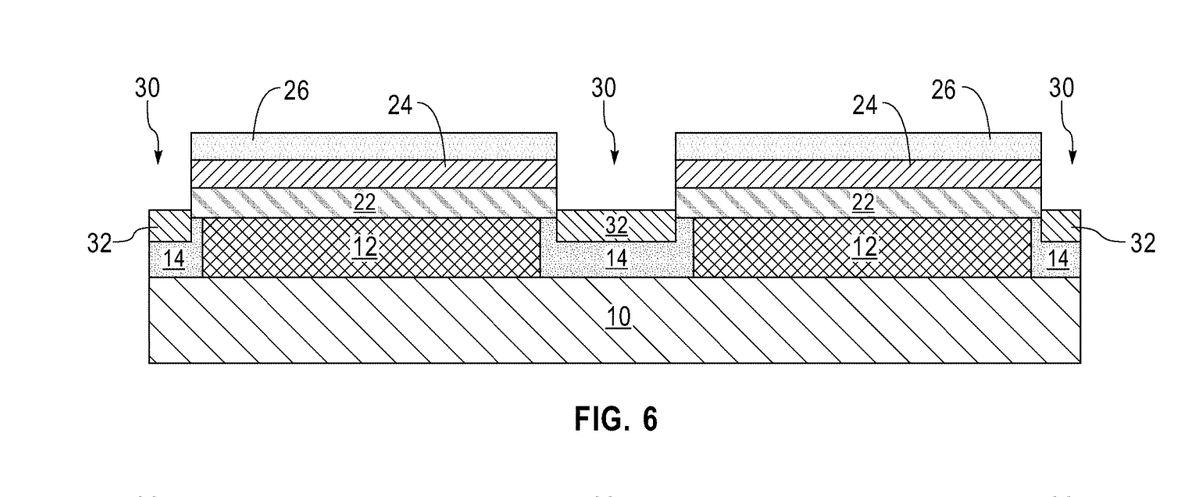
FIG. 6 is a cross-sectional view of the exemplary semiconductor structure of FIG. 5 after forming a shallow trench isolation (STI) layer on bottoms of the trenches.

Referring to FIG. 6, there is illustrated the exemplary semiconductor structure of FIG. 5 after forming a shallow trench isolation (STI) layer 32 on the recessed surfaces of the second well regions 14, filling a bottom portion of each trench 30. The STI layer 32 laterally surrounds unrecessed portions of the second well regions 14, and has a top surface coplanar with, or above the top surface of each first well region 12.

In one embodiment, the STI layer 32 may be formed by first depositing a trench dielectric material such as, a trench dielectric oxide, over the hard mask portions 26 and within the trenches 30 using a deposition process, such as, for example, CVD or PVD. In one embodiment, the trench dielectric oxide is silicon dioxide. The deposited trench dielectric material can then be planarized by a planarization technique such as, for example, chemical mechanical planarization (CMP) followed by an etched back process to recess the deposited trench dielectric material to the desired thickness. An anisotropic etch such as, for example, RIE may be employed to etch the deposited trench dielectric material selective to the doped semiconductor portions 22, 24 and the hard mask portions 26. In another embodiment, the STI layer 32 may be formed utilizing a direct fill process, during which the trench dielectric material only deposits on the bottom surfaces of the trenches 30, but not along sidewalls of the trenches 30.

Figure 7:
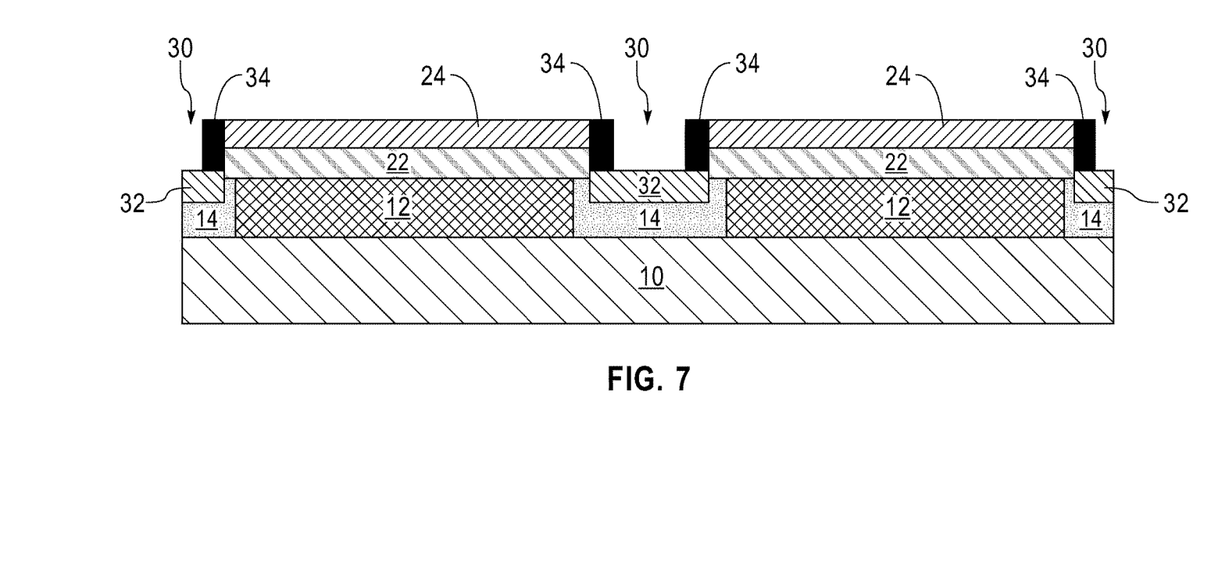
FIG. 7 is a cross-sectional view of the exemplary semiconductor structure of FIG. 6 after forming a conductive strap structure around each pair of the first doped semiconductor portion and the second doped semiconductor portion.

Referring to FIG. 7, there is illustrated the exemplary semiconductor structure of FIG. 6 after forming a conductive strap structure 34 around each pair of the first doped semiconductor portion 22 and the second doped semiconductor portion 24. Each second doped semiconductor portion 24 is thus electrically tied to a corresponding first doped semiconductor portion 22 by a conductive strap structure 34.

Each conductive strap structure 34 may include a metal semiconductor alloy such as, for example, a metal silicide or a metal germicide. The conductive strap structures 34 can be formed, for example, by first depositing a metal layer (not shown) on physically exposed surfaces of the STI layer 32, each first doped semiconductor portion 22, each second doped semiconductor portion 24 and the hard mask portions 26. The metal layer may include a conductive metal such as Ni, Co, Pt, W, Ti, Ta, a rare earth metal (e.g., Er, Yt, La), an alloy thereof, or any combination thereof. The metal layer may be deposited by CVD, PVD or atomic layer deposition (ALD). The thickness of the metal layer can be 2 nm to 20 nm, although lesser and greater thicknesses can also be employed. Subsequently, the resulting structure is subjected to an annealing process, such as a thermal annealing process or a laser annealing process, so as to react the metal layer with the first doped semiconductor portions 22 and the second doped semiconductor portions 24, thereby providing conductive strap structures 34. The unreacted portion of the metal layer is then removed, for example, by an etch, which can be a wet etch that removes the metal layer selective to the conductive strap structures 34 and the hard mask portions 26.

After annealing, the hard mask portions 26 are removed, for example, by CMP or an etch back process. The etch used to remove the hard mask portions 26 can be a dry etch such as, for example, RIE or a wet etch that removes the hard mask portions 26 selective to the second doped semiconductor portions 24, the STI layer 32 and the conductive strap structures 34.

Figure 8:
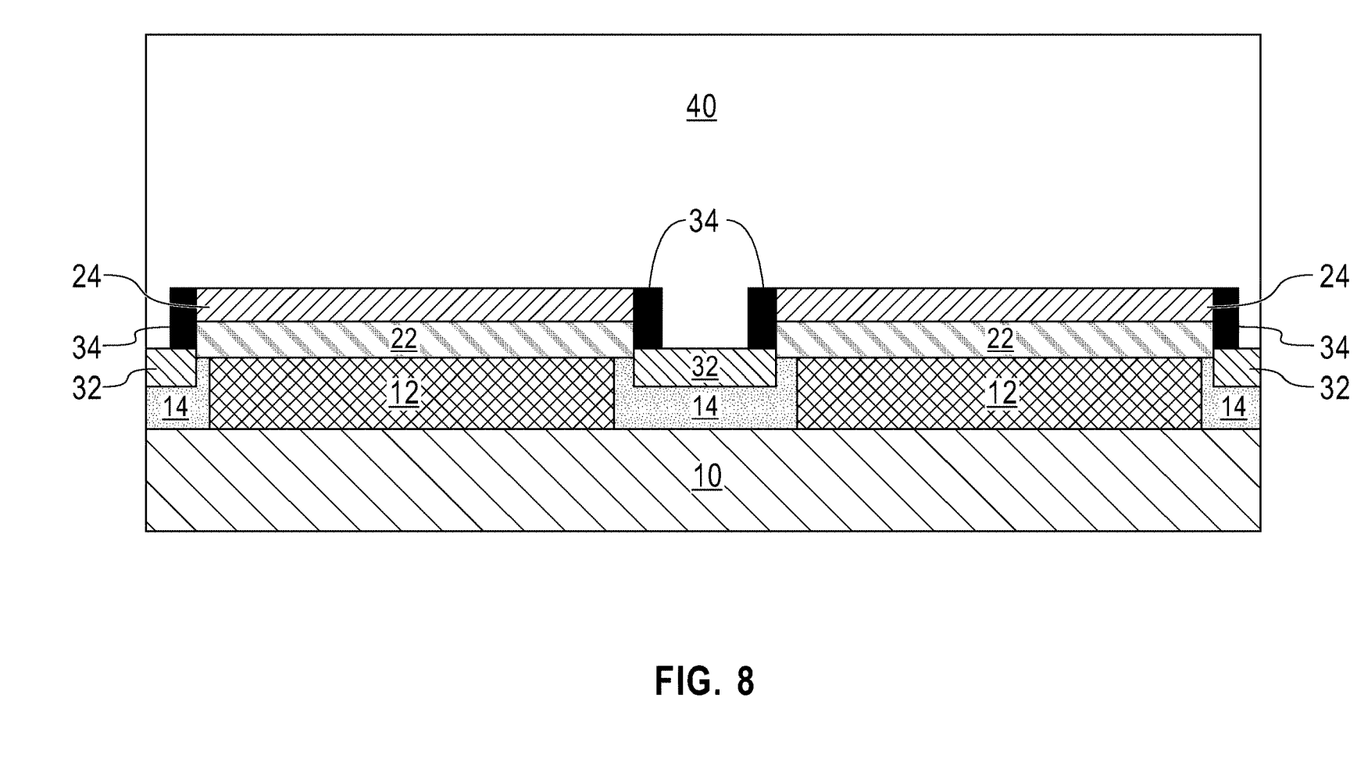
FIG. 8 is a cross-sectional view of the exemplary semiconductor structure of FIG. 7 after forming an interlevel dielectric (ILD) layer on the second doped semiconductor portions, the STI layer and the conductive strap structures.

Referring to FIG. 8, there is illustrated the exemplary semiconductor structure of FIG. 7 after forming an interlevel dielectric (ILD) layer 40 on the second doped semiconductor portions 24, the STI layer 32 and the conductive strap structures 34. The ILD layer 40 fills the spaces between the conductive strap structures 34.

The ILD layer 40 may be formed from a dielectric material that can be easily planarized. For example, the ILD layer 40 can be a doped silicate glass, an undoped silicate glass (silicon oxide), an organosilicate glass (OSG), a flowable oxide, a high density plasma oxide, or a porous dielectric material. The ILD layer 40 may be deposited, for example, by CVD, PVD or spin coating. The ILD layer 40 can be deposited to a thickness such that an entirety of the top surface of the ILD layer 40 is formed above the top surfaces of the second doped semiconductor portions 24. In one embodiment, the thickness of the ILD layer 40 may be from 100 nm to 1,000 nm, although lesser and greater thicknesses can also be employed. In some embodiments of the present application, following the deposition of the ILD layer 40, the ILD layer 40 can be planarized, for example, by CMP, thereby providing a planarized top surface.

Figure 9:
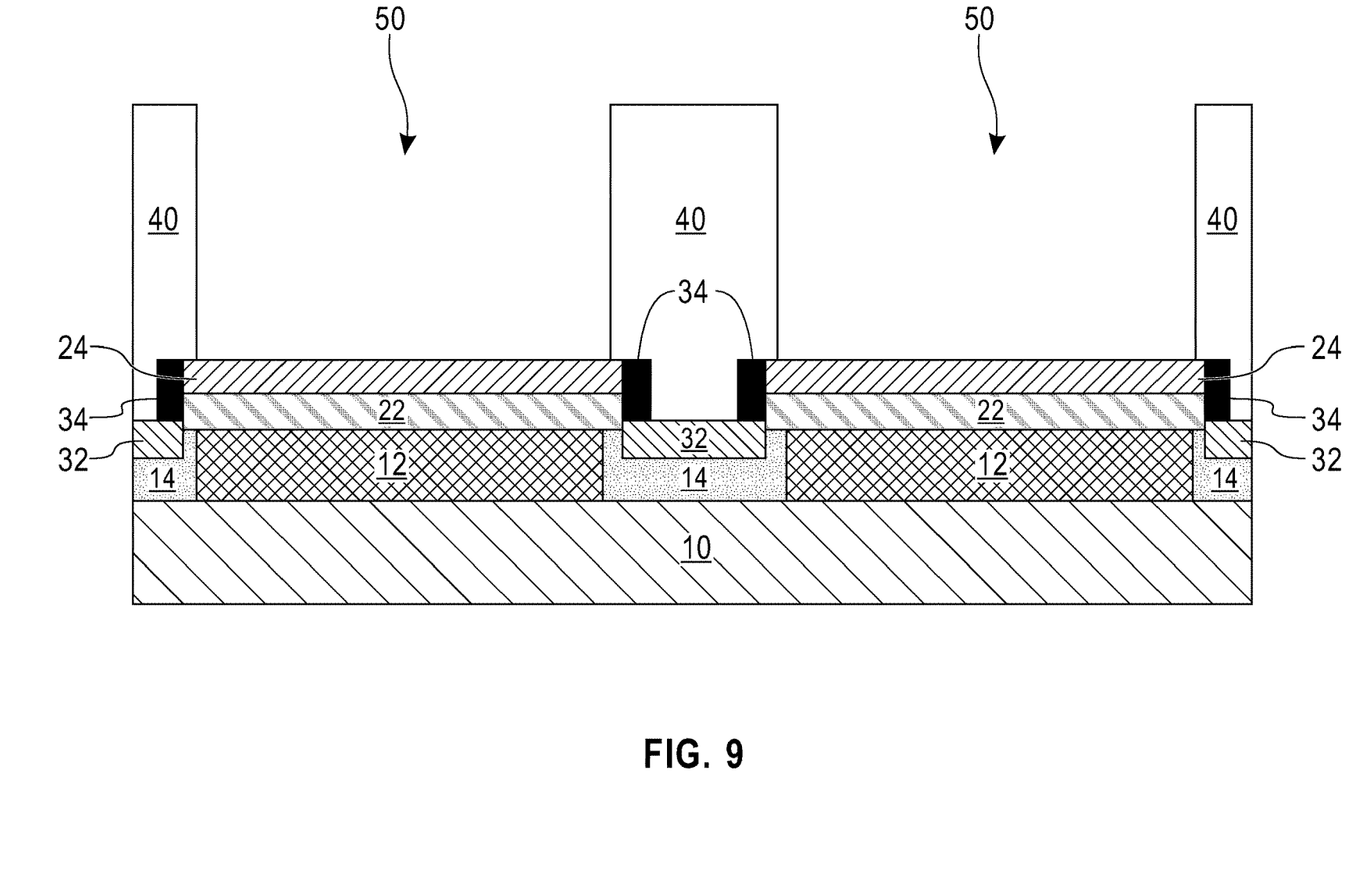
FIG. 9 is a cross-sectional view of the exemplary semiconductor structure of FIG. 8 after forming an opening extending through the ILD layer to expose at least a portion of each second doped semiconductor portion.

Referring to FIG. 9, there is illustrated the exemplary semiconductor structure of FIG. 8 after forming openings 50 extending through the ILD layer 40. Each opening 50 exposes at least a portion of one of the second doped semiconductor portions 24.

The openings 50 may be formed by applying a mask layer (not shown) over the ILD layer 40 and then lithographically patterning the mask layer to form openings therein. The mask layer may be a photoresist layer or a photoresist layer in conjunction with hard mask layer(s). The pattern in the mask layer is subsequently transferred into the ILD layer 40 to form the openings 50 therein. In one embodiment, an anisotropic etch may be performed to remove portions of the ILD layer 40 that are not covered by the patterned mask layer. The anisotropic etch can be a dry etch such as, for example, RIE or a wet etch. After formation of the openings 50, the patterned mask layer can be removed, for example, by oxygen-based plasma etching.

Figure 10:
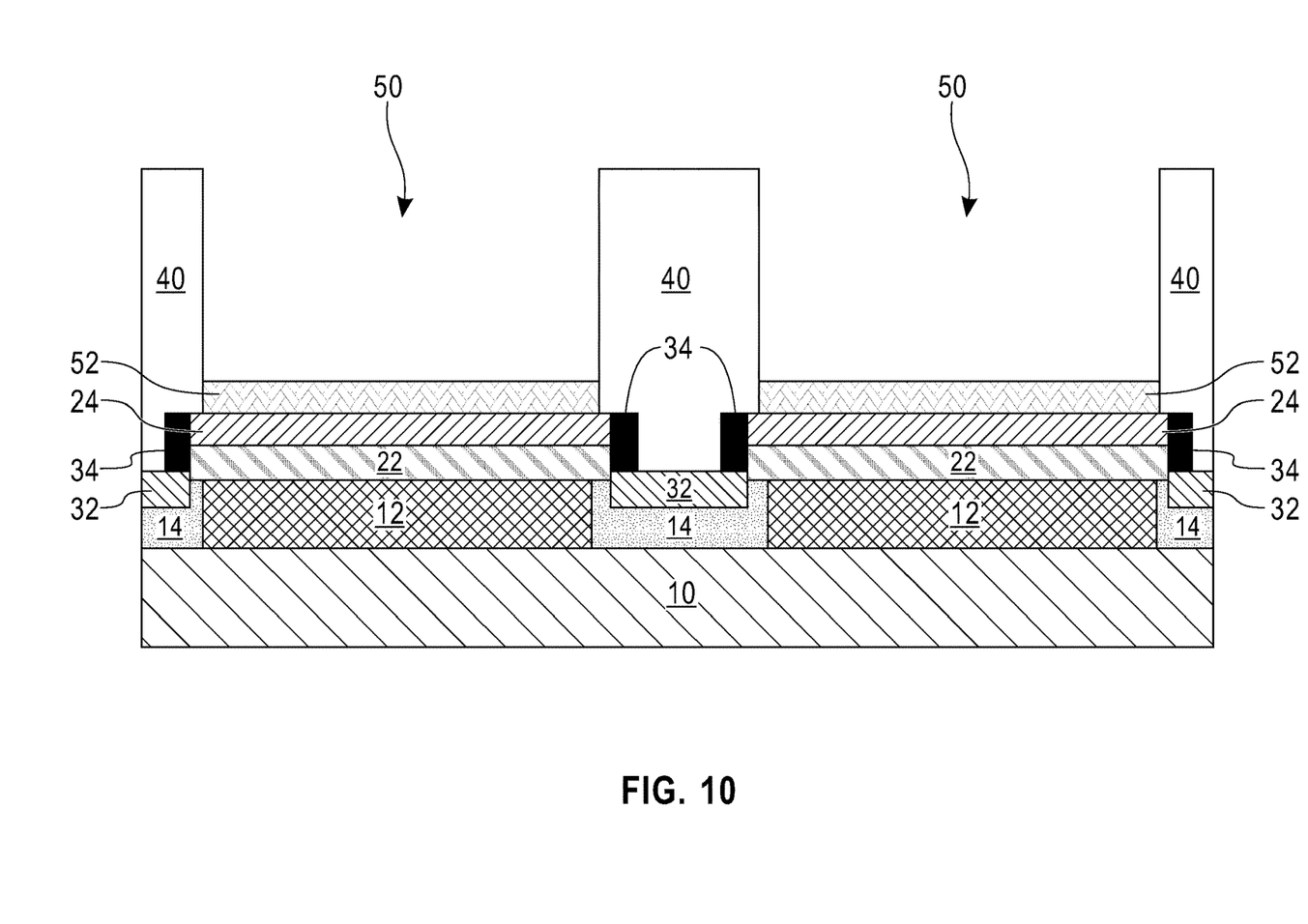
FIG. 10 is a cross-sectional view of the exemplary semiconductor structure of FIG. 9 after epitaxially growing a third doped semiconductor portion from a physically exposed surface of the second doped semiconductor portion within each opening.

Referring to FIG. 10, there is illustrated the exemplary semiconductor structure of FIG. 9 after epitaxially growing a third doped semiconductor portion 52 from a physically exposed surface of the second doped semiconductor portion 24 within each opening 50.

The third doped semiconductor portion 52 may include a semiconductor material the same as, or different from, the semiconductor material that provides the second doped semiconductor portion 24. For example, the upper doped semiconductor portion 52 may be composed of Si or SiGe. The third doped semiconductor portion 52 is counter-doped with respect to the second doped semiconductor portion 24. In one embodiment and when the second doped semiconductor portion 24 is doped with a p-type dopant, the third doped semiconductor portion 52 is doped with an n-type dopant, and vice versa. A p-n junction is thus present at the interface between the second doped semiconductor portion 24 and the third doped semiconductor portion 52. The concentration of the dopant in the upper doped semiconductor portion 52 can be from $1\times10^{19}$ atoms/cm$^3$ to $4\times10^{20}$ atoms/cm$^3$. Each pair of the second doped semiconductor portion 24 and the third doped semiconductor portion collectively constitute a top diode.

The third doped semiconductor portion 52 may be formed by a selective epitaxial growth process. The selective epitaxial growth process deposits the semiconductor material that provides the third doped semiconductor portion 52 only on the semiconductor surfaces (i.e., physically exposed surfaces of the second doped semiconductor portion), but not on dielectric surface, such as the ILD layer 40. In one embodiment, the third doped semiconductor portion 52 is formed by MOCVD.

The dopant can be provided during the epitaxial growth process by in-situ doping, or after epitaxial growth process by ion implantation or gas phase doping. In some embodiments, a timed epitaxial growth process can be used such that the deposition only partially fills each opening 50. A recess etch may then be used to remove a topmost portion of the deposited semiconductor material within each opening 50 so as to provide the top doped semiconductor portions 52. A top surface of the third doped semiconductor portion 52 is thus located below the top surface of the ILD layer 40.

Figure 11:
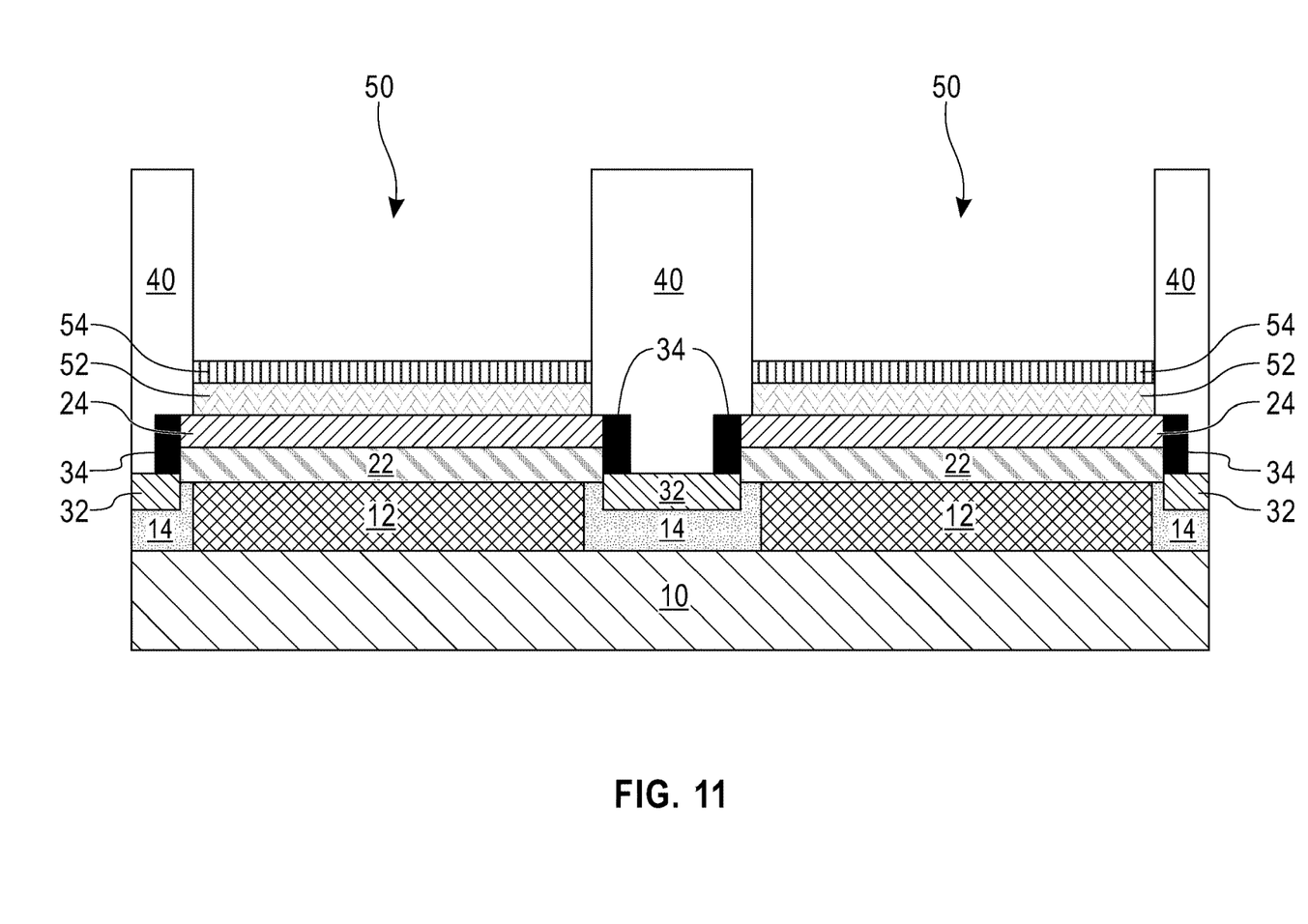
FIG. 11 is a cross-sectional view of the exemplary semiconductor structure of FIG. 10 after forming a contact landing structure on each third doped semiconductor portion.

Reference to FIG. 11, there is illustrated the exemplary semiconductor structure of FIG. 10 after forming a contact landing structure 54 on each third doped semiconductor portion 52. The contact landing structures 54 may include a metal semiconductor alloy such as, for example, a metal silicide or a metal germicide. The contact landing structures 54 can be formed by performing the processing steps as described above in FIG. 7 for formation of conductive strap structures 34.

Figure 12:
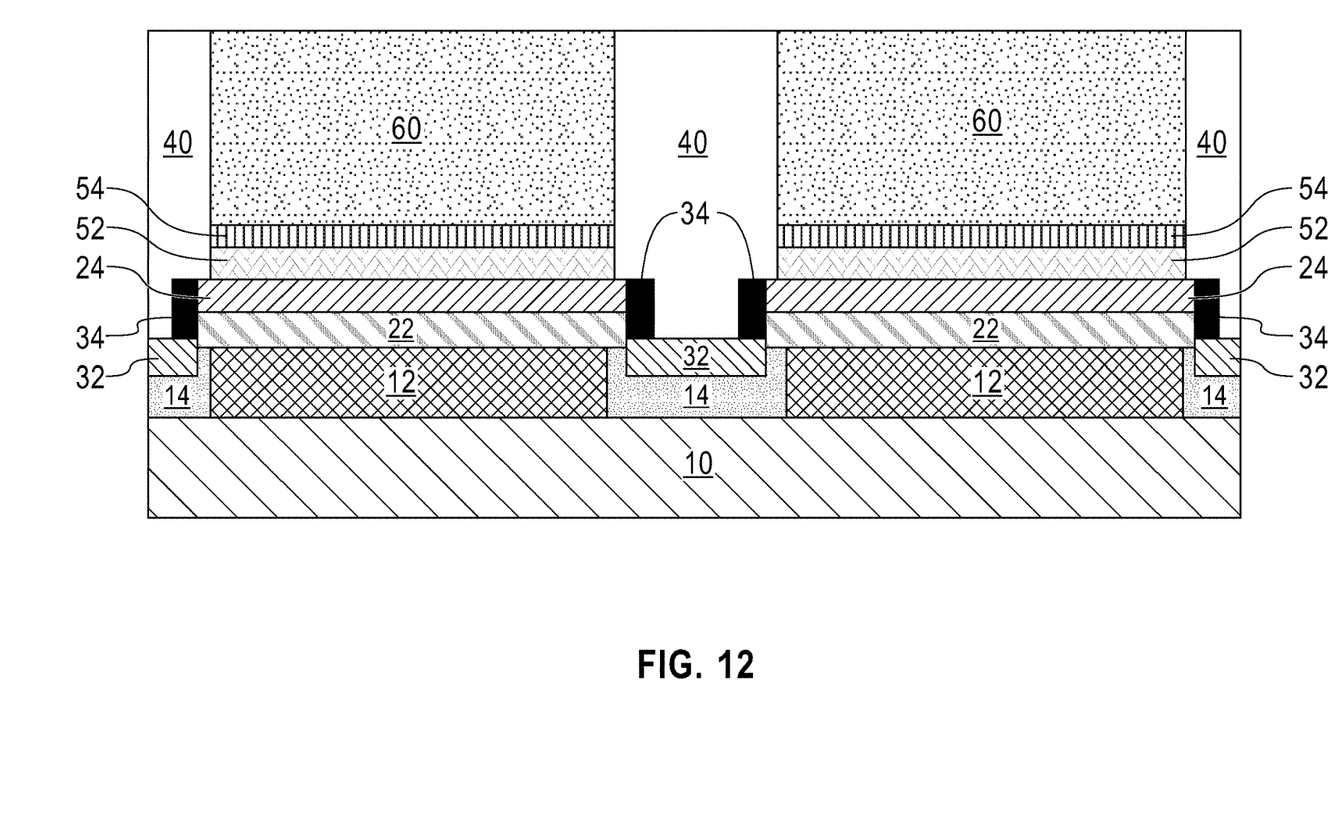
FIG. 12 is a cross-sectional view of the exemplary semiconductor structure of FIG. 11 after filling the openings with dielectric fill portions.

Reference to FIG. 12, there is illustrated the exemplary semiconductor structure of FIG. 11 after forming a dielectric fill portion 60 on each contact landing structure 54. The dielectric fill portion 60 completely fills each opening 50. The dielectric fill portions 60 may include a dielectric material the same as, or different from, the dielectric material that provides the ILD layer 40. For example, the dielectric fill portions 60 may include a dielectric oxide such as, for example, silicon dioxide or a flowable oxide. The dielectric fill portions 60 may be formed by a deposition process such as, for example, CVD, PVD or spin coating. Subsequently, a planarization process can be performed to planarize the dielectric fill portions 60, which stops on the top surface of the ILD layer 40. The planarization process may include, for example, CMP. After planarization, the top surface of each dielectric fill portion 60 is coplanar with the top surface of the ILD layer 40.

A plurality of ESD protection structures is thus formed. The ESD protection structures are arranged side by side and are separated from each other by an STI layer 32. Each ESD protection structure contains a bottom diode and a top diode vertically stacked on the bottom diode. The bottom diode includes a first well region 12 of a first conductivity type embedded in a semiconductor substrate 10 and a first doped semiconductor portion 22 of a second conductivity type located on the first well region 12. The top diode includes a second doped semiconductor portion 24 of the first conductivity type located on the first doped semiconductor portion 22 and a third doped semiconductor portion 52 of the second conductivity type located on the second doped semiconductor portion 24. The bottom diode (12, 22) and the top diode (24, 52) are serially connected by a conductive strap structure 34 present on sidewalls of the first doped semiconductor portion 22 and the second doped semiconductor portion 24.

In the present application, by vertically stacking two diodes, the diode footprint of the resulting ESD protection structure can be reduced by 50% compared to the prior art structure employing two planar diodes. In addition, since the bottom diode (12, 22) and the top diode (24, 52) are electrically connected by a conductive strap structure 34, BEOL wiring required for interconnecting two planar diodes in the conventional ESD protection structure is no longer needed. The space for BEOL wiring can thus be saved.

Figure 13A:
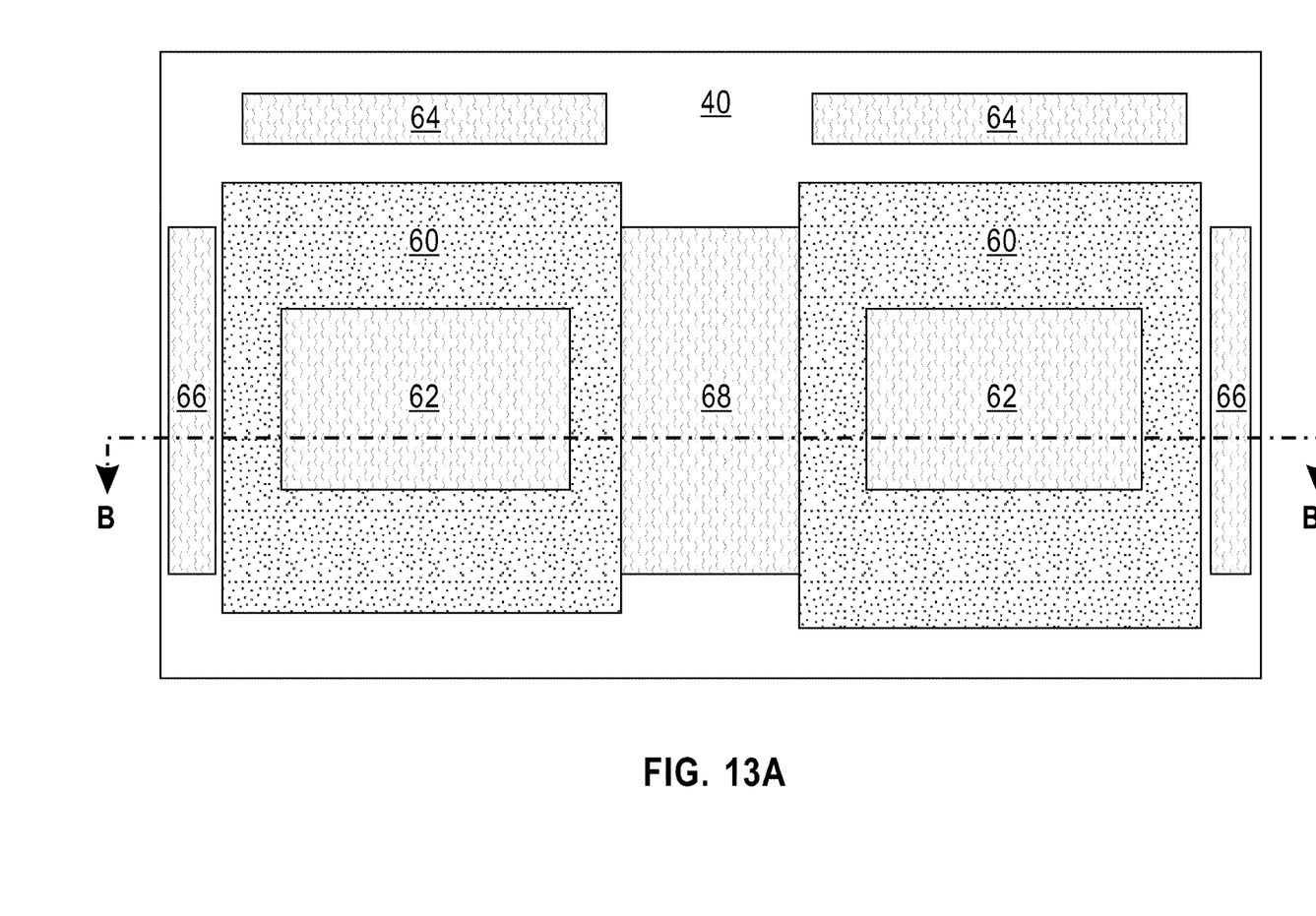
FIG. 13A is a top view of the exemplary semiconductor structure of FIG. 12 after forming various contact structures.
Figure 13B:
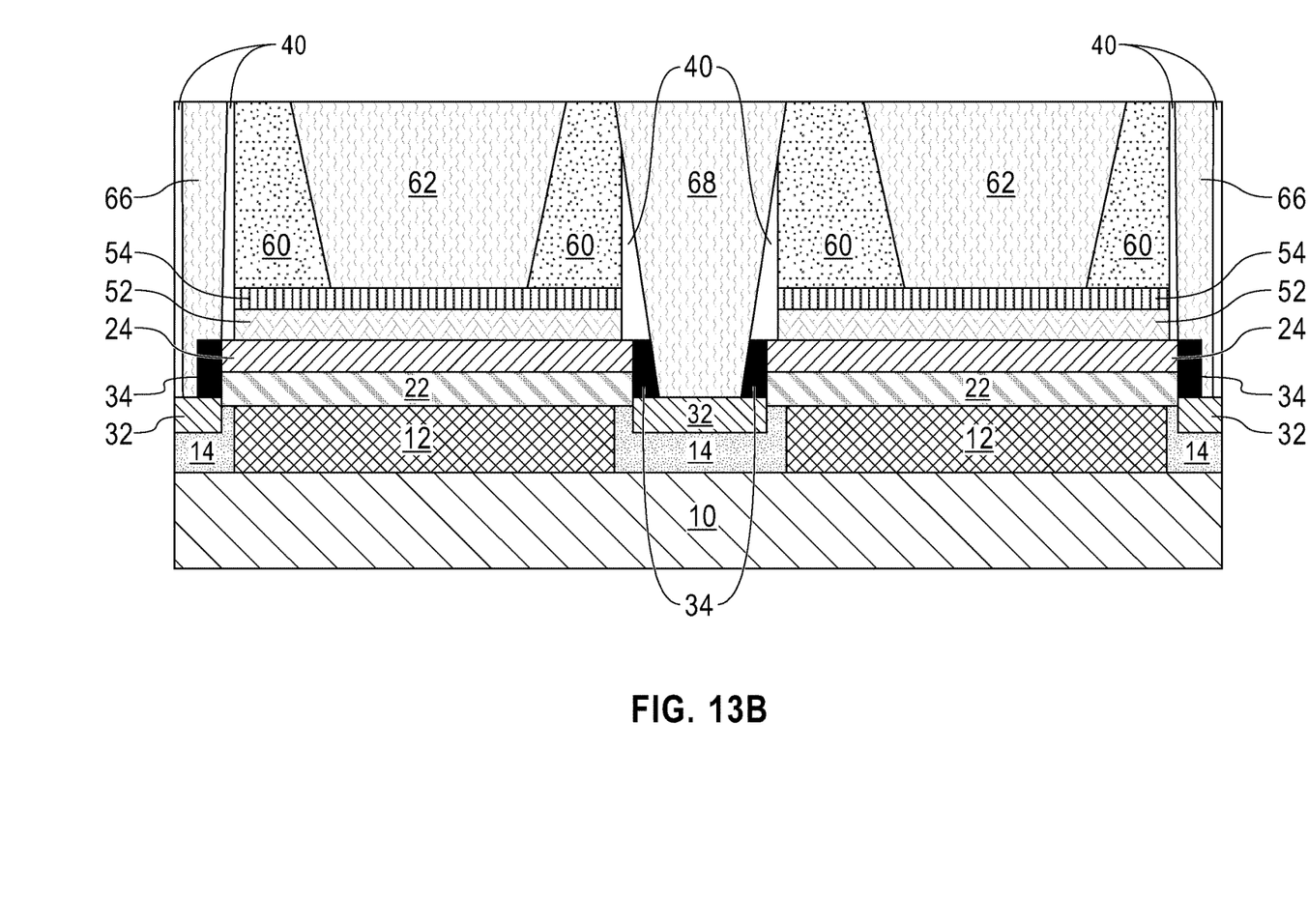
FIG. 13B is a cross-sectional view of the exemplary semiconductor structure of FIG. 13A along line B-B'.

Reference to FIGS. 13A and 13B, there are illustrated the exemplary semiconductor structures of FIG. 12 after forming contact structures providing electrical connections to various components of ESD protection structures (12, 22, 24, 52). The contact structures include a first contact structure 62 extending through the dielectric fill portion 60 to form contact with each contact landing structure 54, a second contact structure 64 extending the ILD layer 40 to form contact with each first well region 12, and a third contact structure extending through the ILD layer 40 to form contact with each conductive strap structure 34. The adjacent ESD protection structures (12, 22, 24, 52) can be electrically connected by a shared contact structure 68. As shown, the shared contact structure 68 extends through the ILD layer 40 connecting adjacent conductive strap structures 34.

When wired, the first contact structure 62 is coupled to a supply voltage $V_{dd}$, the second contact structure 64 is coupled to a node that is coupled to an input/output pin $V_{pin}$ and an IC, and the third contact structure 66 is coupled to ground $V_{ss}$.

The contact structures 62, 64, 66, 68 can be formed by formation of contact openings (not shown) utilizing a combination of lithographic patterning and anisotropic etch followed by deposition of a conductive material such as, for example, Al, Pt, Au, Cu or W. The conductive material may be deposited by a suitable deposition process, for example, CVD, PECVD, PVD or plating. A planarization process, for example, CMP, is performed to remove any conductive material from the top surfaces of the ILD layer 40 and the dielectric fill portions 60.

Optionally, contact liners (not shown) may be formed on the sidewalls and bottoms surfaces of contact openings before filling the contact openings with the conductive material. The contact liners may include TiN.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
    a bottom diode comprising:
        a first well region of a first conductivity type embedded in a semiconductor substrate, and
        a first doped semiconductor portion of a second conductivity type located on the first well region, wherein the second conductivity type is opposite from the first conductivity type;
    a top diode vertically stacked on the bottom diode and comprising:
        a second doped semiconductor portion of the first conductivity type located on the first doped semiconductor portion, and
        a third doped semiconductor portion of the second conductivity type located on the second doped semiconductor portion; and
    a conductive strap structure laterally contacting the first doped semiconductor portion and the second doped semiconductor portion.

2. The semiconductor structure of claim 1, wherein the conductive strap structure comprises a metal silicide or a metal germicide.

3. The semiconductor structure of claim 1, further comprising a contact landing structure located on the third doped semiconductor portion.

4. The semiconductor structure of claim 3, wherein the contact landing structure comprises a metal silicide or a metal germicide.

5. The semiconductor structure of claim 3, wherein the semiconductor substrate further comprising second well regions of the second conductivity type embedded in the semiconductor substrate, wherein the second well regions are separated from each other by the first well region, and each of the second well regions has a recessed surface located below a top surface of the first well region.

6. The semiconductor structure of claim 5, further comprising a shallow trench isolation (STI) layer present on the recessed surface of each of the second well regions, wherein the STI layer has a top surface coplanar with or above the top surface of the first well region, and wherein the conductive strap structure is located on the STI layer.

7. The semiconductor structure of claim 6, further comprising an interlevel dielectric (ILD) layer laterally surrounding the conductive strap structure, the third doped semiconductor portion and the contact landing structure.

8. The semiconductor structure of claim 7, further comprising a dielectric fill portion located on the contact landing structure.

9. A semiconductor structure comprising:
    a plurality of first well regions of a first conductivity type and a plurality of second well regions of a second conductivity type embedded in a semiconductor substrate, wherein the second conductivity type is opposite from the first conductivity type;
    a first doped semiconductor portion of the second conductivity type located on each of the plurality of first well regions;
    a second doped semiconductor portion of the first conductivity type located on each first doped semiconductor portion;
    a third doped semiconductor portion of the second conductivity type located on each second doped semiconductor portion;
    a conductive strap structure present on sidewalls of each stack of the first doped semiconductor portion and the second doped semiconductor portion; and
    a shared contact structure connecting adjacent conductive strap structures.

10. The semiconductor structure of claim 9, wherein each conductive strap structure comprises a metal silicide or a metal germicide.

11. The semiconductor structure of claim 9, further comprising a contact landing structure located on each third doped semiconductor portion.

12. The semiconductor structure of claim 11, wherein the contact landing structure comprises a metal silicide or a metal germicide.

13. The semiconductor structure of claim 11, further comprising a first contract structure contacting each contact landing structure, and a second contact structure contacting each of the plurality of first well regions.

* * * * *